United States Patent
Riedl

(10) Patent No.: US 7,851,910 B2
(45) Date of Patent: Dec. 14, 2010

(54) DIFFUSION SOLDERED SEMICONDUCTOR DEVICE

(75) Inventor: Edmund Riedl, Obertraubling-Gebelkofen (DE)

(73) Assignee: Infineon Technologies AG, Neubiberg (DE)

( * ) Notice: Subject to any disclaimer, the term of this patent is extended or adjusted under 35 U.S.C. 154(b) by 769 days.

(21) Appl. No.: 10/551,745

(22) PCT Filed: Mar. 31, 2004

(86) PCT No.: PCT/DE2004/000668

§ 371 (c)(1),
(2), (4) Date: Mar. 19, 2007

(87) PCT Pub. No.: WO2004/088725

PCT Pub. Date: Oct. 14, 2004

(65) Prior Publication Data

US 2008/0014460 A1 Jan. 17, 2008

(30) Foreign Application Priority Data

Apr. 1, 2003 (DE) ................... 103 14 876

(51) Int. Cl.
*H01L 23/48* (2006.01)
*H01L 23/52* (2006.01)
*H01L 29/40* (2006.01)

(52) U.S. Cl. ............... 257/734; 257/736; 257/737

(58) Field of Classification Search ........... 257/666, 257/734–741, 777–778, E25.006, E23.001, 257/E23.02, E23.021

See application file for complete search history.

(56) References Cited

U.S. PATENT DOCUMENTS

| 2,746,140 | A | | 5/1956 | Belser |
| 4,988,035 | A | | 1/1991 | Ueno et al. |
| 5,061,442 | A | | 10/1991 | Ozimek |
| 5,225,157 | A | | 7/1993 | McKay |
| 5,249,100 | A | | 9/1993 | Satoh et al. |
| 5,882,955 | A | * | 3/1999 | Huang et al. ............ 438/111 |
| 6,083,770 | A | * | 7/2000 | Sato et al. ............... 257/467 |
| 6,293,457 | B1 | * | 9/2001 | Srivastava et al. ....... 228/254 |
| 6,888,167 | B2 | * | 5/2005 | Slater et al. ............... 257/81 |
| 2002/0047217 | A1 | | 4/2002 | Zakel et al. |
| 2005/0048758 | A1 | | 3/2005 | Hosseini et al. |

FOREIGN PATENT DOCUMENTS

DE 2930779 2/1980

(Continued)

OTHER PUBLICATIONS

Chin et al., Advances in bonding technology for electronic packaging, Journal of Electronic Packaging, vol. 115, Jun. 1993, 1 pp.

*Primary Examiner*—Cuong Q Nguyen
(74) *Attorney, Agent, or Firm*—Dicke, Billig & Czaja, PLLC

(57) ABSTRACT

The invention relates to a process for the multi-stage production of diffusion-soldered joints for power components with semiconductor chips, the melting points of diffusion-soldering alloys and diffusion-soldered joints being staggered in such a manner that a first melting point of the first diffusion-soldering alloy is lower than a second melting point of the second diffusion-soldering alloy, and the second melting point being lower than a third melting point of a first diffusion-soldered joint of the first diffusion-soldering alloy.

11 Claims, 3 Drawing Sheets

FOREIGN PATENT DOCUMENTS

| | | |
|---|---|---|
| DE | 4016384 | 11/1990 |
| DE | 19528441 | 9/1996 |
| DE | 19531158 | 2/1997 |
| DE | 19532250 | 3/1997 |
| DE | 19615841 | 11/1997 |
| DE | 19730118 | 1/1999 |
| DE | 10014308 | 10/2001 |
| DE | 10208635 | 9/2003 |
| EP | 0114952 | 8/1984 |
| EP | 0055368 | 6/1985 |
| EP | 1262267 | 4/2002 |
| JP | 54150076 | 11/1979 |
| JP | 05237694 | 9/1993 |
| JP | 2000294444 | 10/2000 |
| JP | 2001077049 | 3/2001 |
| JP | 2002305213 A | 10/2002 |
| WO | 0021346 | 4/2000 |
| WO | 03072288 | 9/2003 |

\* cited by examiner

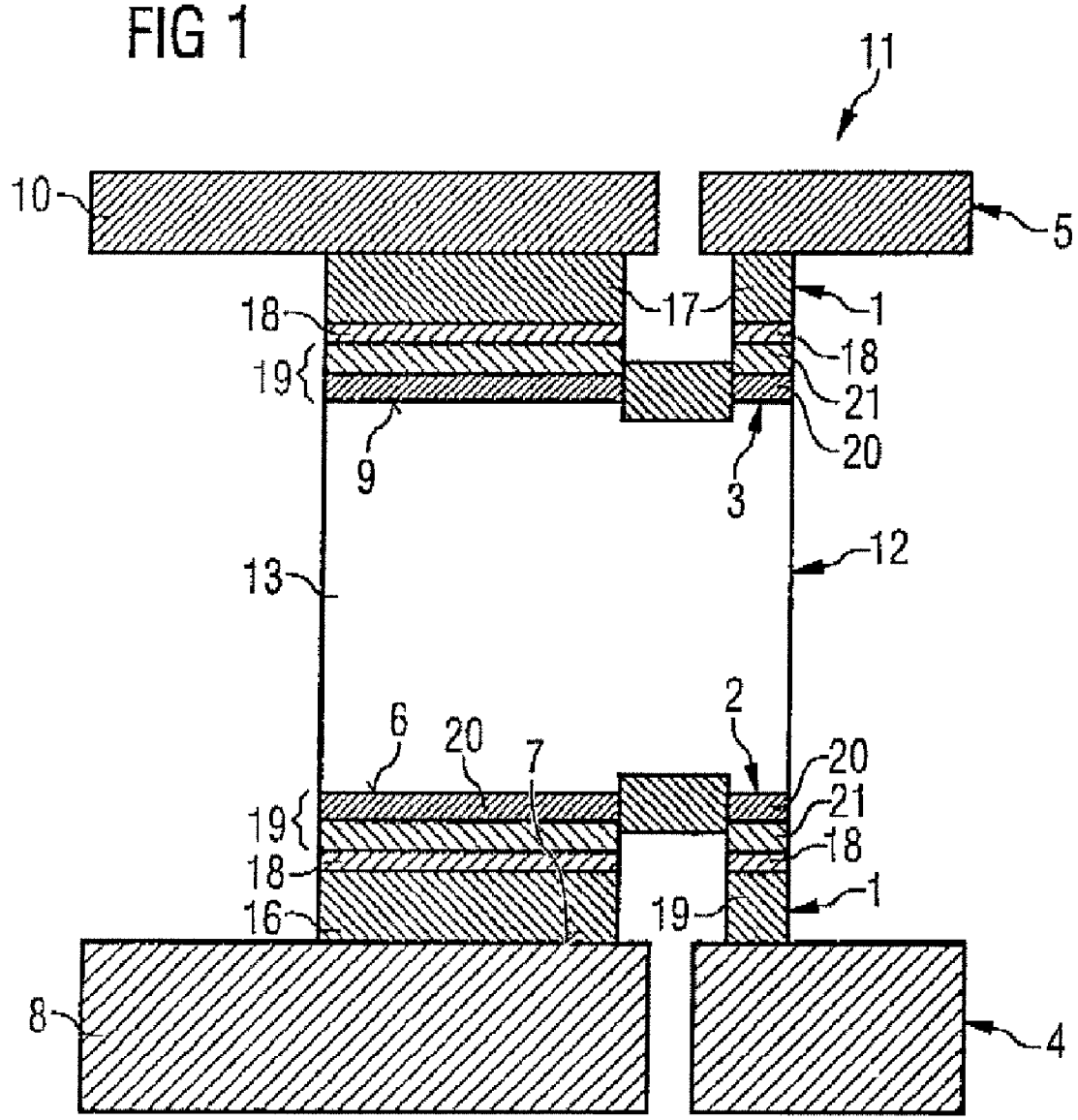

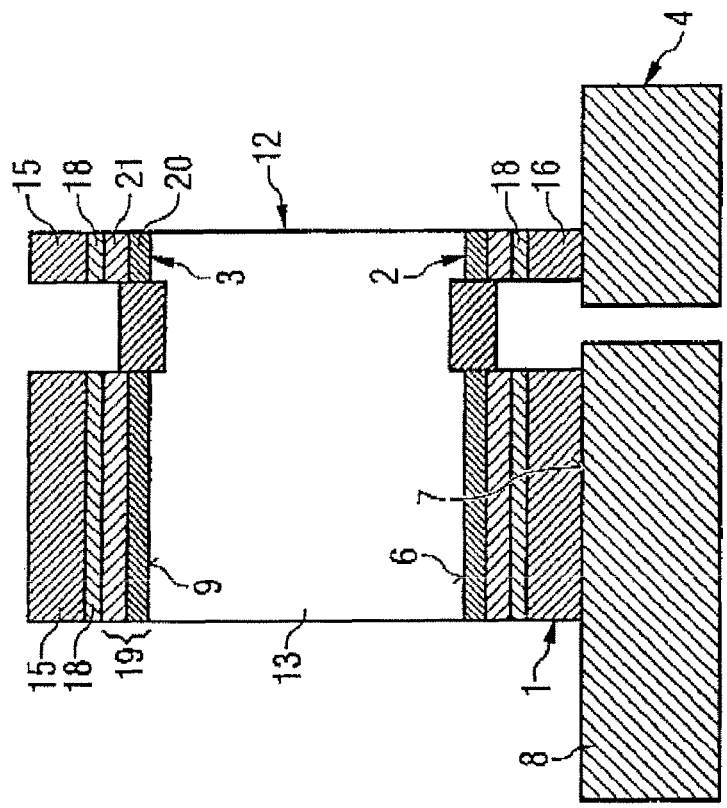
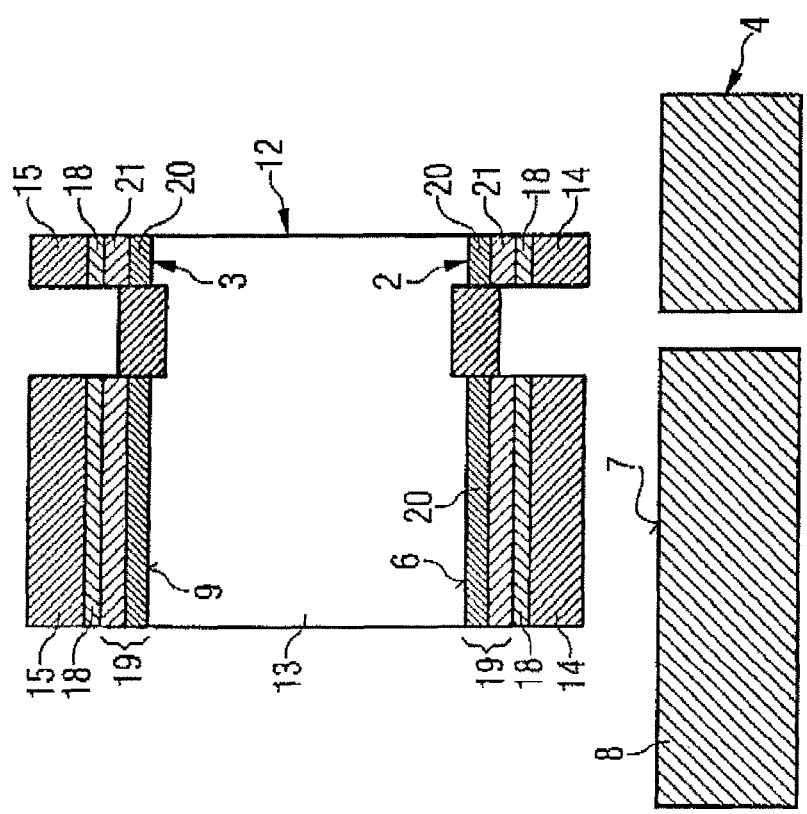

DIFFUSION SOLDERED SEMICONDUCTOR DEVICE

CROSS-REFERENCE TO RELATED APPLICATIONS

This Application is a U.S. National filing under 35 U.S.C. §371 of PCT/DE2004/000668, filed Mar. 31, 2004, which claims benefit of German Application No. DE10314876.0 (3) filed Apr. 1, 2003, both of which are incorporated by reference herein.

BACKGROUND

The invention relates to a process for the multi-stage production of diffusion-soldered joints for power components with semiconductor chips, and to a power electronic component.

Diffusion-soldered joins are known from document DE 195 32 250 A1 and are used to produce a thermally stable joint by means of diffusion-soldering. For this purpose, a first body is coated with a high-melting metal and a second body is coated with a low-melting metal. Then, the two bodies can be joined by a diffusion-soldered joint at a predetermined temperature and under a predetermined contact pressure. In a diffusion-soldered joint, high-melting intermetallic phases are formed, the melting points of which are higher than the melting point of the low-melting metal. The known process can be used to produce individual thermally stable joints in a power electronic component.

However, a power electronic component has a plurality of joints, which have to be realized in multi-stage processes. This produces unreliable joints.

SUMMARY

Embodiments of the invention provides a process for the multi-stage production of diffusion-soldered joints on a carrier underside and carrier top side to a substrate for the carrier underside and a further substrate for the carrier top side.

A first side of a carrier or semiconductor is coated with a first diffusion-soldering alloy. A diffusion-soldering alloy of this type includes a mixture of a high-melting metal component and a low-melting metal component, without intermetallic phases already having formed. Then, a second side of the carrier or semiconductor is coated with a second diffusion-soldering alloy. The first and second diffusion-soldering alloys belong to different diffusion-soldering systems in terms of their composition and metallic elements.

The first and second diffusion-soldering alloys are matched to one another by selection of materials and components in such a manner that the melting points of the diffusion-soldering alloys and of the diffusion-soldered joints are staggered in such a manner that a first melting point of the first diffusion-soldering alloy is lower than a second melting point of the second diffusion-soldering alloy, and that the second melting point is lower than a third melting point of a first diffusion-soldered joint of the first diffusion-soldering alloy.

A first substrate is diffusion-soldered to the first side of the carrier or semiconductor by heating the first diffusion-soldering alloy to the first melting point. This forms a first thermally stable diffusion-soldered joint, the melting point of which is higher than the second melting point of the second diffusion-soldering alloy. This is followed by a second substrate being diffusion-soldered to the second side of the carrier or semiconductor by heating the second diffusion-soldering alloy to the second melting point. Since this second melting point is lower than the third melting point of the first diffusion-soldered joint, the existing first diffusion-soldered joint is retained in a thermally stable manner during this multi-stage production with staggered melting points of the diffusion-soldering operations.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 is a cross-sectional view of a carrier with diffusion-soldered joints to a lower first substrate and to an upper second substrate in accordance with one embodiment.

FIG. 2 shows a diagrammatic cross section through a carrier which has a first diffusion-soldering alloy on its underside and a second diffusion-soldering alloy on its top side, before the carrier is diffusion-soldered to a first substrate.

FIG. 3 shows a diagrammatic cross section through the carrier shown in FIG. 2 following first diffusion-soldering of the carrier to the substrate.

DETAILED DESCRIPTION

Figure 4:
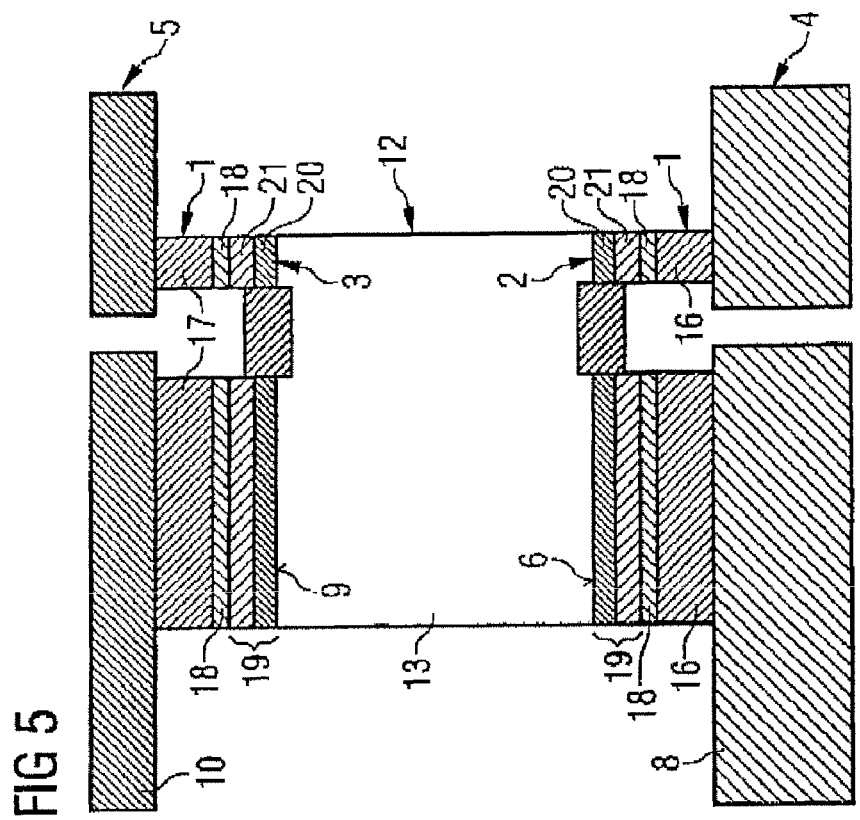
FIG. 4 shows a diagrammatic cross section through the carrier shown in FIG. 3 prior to the application of a second substrate to the top side of the carrier.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

This process for the multi-stage production of diffusion-soldered joints has the advantage that both a diffusion-soldered joint to the underside and a diffusion-soldered joint to the top side of a carrier are possible, on account of the suitable matching of the diffusion-soldering systems for the underside and top side of the carrier. A power electronic component which is produced in this way does not have any weak points in the joining technology and can therefore be subjected to extremely high thermal stresses.

In this context, the invention takes account of the fact that a power electronic component with semiconductor chips has a substrate onto which semiconductor chips are soldered.

Subsequent soldering of flat conductors to the top side of the semiconductor chips would lead to the soldered rear side becoming detached, which restricts the ability of the power component to withstand thermal stresses. Therefore, the connections on the top side are often not produced by soldering, but rather by bonded joints between electrodes on the top side of the semiconductor chips and flat conductors which lead outward. Both conventional soldered joints and diffusion-soldered joints of the chip rear side to a substrate do not reduce the limited ability of bonded joints on the top side of power semiconductor chips to withstand thermal stresses. The invention increases the ability of power electronic components to withstand thermal stresses by producing thermally stable joints both on the rear side of the semiconductor chip and on the top side of the semiconductor chip.

Table 1 shows possible alloying partners for diffusion-soldered joints as well as the melting points which it is possible to use prior to formation of intermetallic phases as first and second melting points and the melting points of the intermetallic phases which are formed in a diffusion-soldered joint, which should be taken into account as the third melting point when employing the process according to the invention. This table reveals preferred systems for the alloy composition of a first diffusion-soldering alloy and a second diffusion-soldering alloy.

A first diffusion-soldering alloy, which has a first melting point and a composition comprising Ga-yNi where 1% by weight $<y<20$% by weight or Ga-xCu where 1% by weight $<x<40$% by weight or Ga-yAg where 1% by weight $<y<40$% by weight, can be applied to the first side of a carrier or a semiconductor chip. A second diffusion alloy, which includes In-xAg where 1% by weight $<x<30$% by weight or Sn-yAg where 1% by weight $<y<50$% by weight, can be applied to the second side. This staggering of the diffusion-soldering systems has the advantage that the first diffusion-soldering alloy has extremely low melting points between 26° C. and 31° C., and the two second diffusion-soldering alloys which are possible have relatively high first melting points of 144° C. or 221° C. The last two diffusion-soldering systems listed in Table 1 cannot be used in combination with the first diffusion-soldering alloys indicated here, since their low melting points, at 280° C. and 361° C., respectively, are already higher than some of the melting points of the intermetallic phases of the first diffusion-soldering alloy which form.

If the choice of low-melting first diffusion-soldering alloys is restricted further, it is possible to widen the options for higher-melting diffusion-soldering alloys to be used. For this purpose, a first diffusion-soldering alloy of the composition Ga-yNi where 1% by weight $<y<20$% by weight or Ga-yAg where 1% by weight $<y<40$% by weight is applied to the first side of a carrier or semiconductor chip. A second diffusion alloy of the composition In-xAg where 1% by weight $<x<30$% by weight or Sn-yAg where 1% by weight $<y<50$% by weight or Au-xSn where 5% by weight $<x<38$% by weight, preferably where 10% by weight $<x<30$% by weight, can be applied to the second side of a carrier or semiconductor chip. This staggering of the diffusion-soldering alloys has the advantage that even a melting point of 280° C. is possible as the second melting point.

If the first diffusion-soldering alloy is restricted to just one diffusion-soldering system, for a soldering alloy with an extremely low first melting point of 26° C., it is possible to use a wide range of second diffusion alloys. For this purpose, the first side of a carrier or a semiconductor is coated with a diffusion alloy of the composition Ga-yAg where 1% by weight $<y<40$% by weight. A second diffusion-soldering alloy of the composition In-xAg where 1% by weight $<x<30$% by weight or Sn-yAg where 1% by weight $<y<50$% by weight or Au-xSn where 5% by weight $<x<38$% by weight, preferably where 10% by weight $<x<30$% by weight or Au-yGe where 4% by weight $<y<50$% by weight, remainder Au, preferably where 7% by weight $<y<20$% by weight, remainder Au, is applied to the second side.

For applications in which a higher first melting point of over 100° C. is desirable, the first side may have a first diffusion alloy of the composition In-xAg where 1% by weight $<x<30$% by weight. Then, a second diffusion alloy of the composition Sn-yAg where 1% by weight $<y<50$% by weight or Au-xSn where 5% by weight $<x<38$% by weight, preferably where 10% by weight $<x<30$% by weight, or Au-yGe where 4% by weight $<y<50$% by weight, remainder Au, preferably where 7% by weight $<y<20$% by weight, remainder Au, is then applied to the second side.

A staggered diffusion system with a first and second diffusion alloy, in which the first diffusion alloy has a first melting point of over 200° C., is possible if the first side has a first diffusion alloy of the composition Sn-yAg where 1% by weight $<y<50$% by weight. A second diffusion-soldering alloy of the composition Au-xSn where 5% by weight $<x<38$% by weight, preferably where 10% by weight $<x<30$% by weight, or Au-yGe where 4% by weight $<y<50$% by weight, remainder Au, preferably where 7% by weight $<y<20$% by weight, remainder Au, is applied to the second side.

The highest demands imposed on melting points can be satisfied by staggering first and second diffusion-soldering alloys in such a way that a first diffusion-soldering alloy of the composition Au-xSn where 5% by weight $<x<38$% by weight, preferably where 10% by weight $<x<30$% by weight, is applied to the first side. A second diffusion-soldering alloy of the composition Au-yGe where 4% by weight $<y<50$% by weight, remainder Au, preferably where 7% by weight $<y<20$% by weight, is applied to the second side.

During heating to the soldering temperatures, relatively brittle intermetallic phases are formed; although these intermetallic phases do allow a thermally stable joint to be produced, if there are differences in the expansion coefficient of the carrier or semiconductor chip and the substrates to be joined to it, there is a risk that the substrates will become detached from the carriers under thermal loads, on account of the brittle intermetallic phases, if the thermal stresses increase on account of the different expansion coefficients of the materials.

If, however, a layer of silver, copper or nickel is applied to each side of the carrier or of the semiconductor chip prior to the application of the diffusion-soldering alloys, this buffer layer has a damping action and advantageously reduces the stresses. This has the advantage that an interlayer of silver, copper or nickel or alloys thereof of this type forms a mechanical buffer, which enables a hard and brittle layer of intermetallic phases to be joined in a relatively soft and resilient manner to the carrier.

For diffusion-soldering alloys comprising Au-yGe where 4% by weight $<y<50$% by weight, in one embodiment 7% by weight $<y<20$% by weight, provides a buffer layer or interlayer of copper or a copper alloy, since intermetallic phases can then form between copper and germanium, with melting points of 614° C. for $Cu_3Ge$ and 742° C. for $Cu_5Ge$.

Silver or copper layers as buffer layers may also be used prior to the application of a diffusion-soldering alloy comprising Sn-yAg where 1% by weight $<y<50$% by weight or Au-xSn where 5% by weight <x<38% by weight, in one embodiment where 10% by weight <x<30% by weight.

To avoid diffusion or alloying of the metal components of the alloys or buffer layers with a semiconductor chip material or a metalization material, such as aluminum for semiconductors, a layer sequence comprising a structured aluminum layer and a titanium layer deposited on top of it is applied prior to the application of a diffusion-soldering alloy to the sides of a semiconductor chip. The aluminum produces a low-resistance transition to the semiconductor material, and the titanium serves as a diffusion barrier to the various metal components of the diffusion-soldering alloys.

A further aspect of the invention provides a power electronic component with a semiconductor chip, the rear side of which is diffusion-soldered to a chip island. Flat conductors are diffusion-soldered to contact surfaces on the top side of the semiconductor chip. The soldered joints include different diffusion-soldering systems, with a first diffusion-soldering alloy on the rear side and a second diffusion-soldering alloy on the top side of the semiconductor chip. For this purpose, the first and second diffusion-soldering alloys have different melting points.

It is in this case possible to use the diffusion-soldering systems listed above. Each of the semiconductor chips of the power component has a layer sequence made up of aluminum and titanium directly on both its rear side and its top side, in order to avoid diffusion and reaction of the components of the alloy with the aluminum and the semiconductor material. A metal layer as buffer layer of copper or silver or nickel or alloys thereof may be arranged on the sides between this layer sequence and the diffusion-soldering alloys, in order on the one hand to promote the formation of a diffusion-soldered joint and on the other hand to allow a mechanical buffer for the different expansion properties of semiconductor chips and substrates.

To summarize, it can be stated that a high-melting joint comprising intermetallic compounds, the melting point of which following the joining operation is higher than the subsequent process temperatures, can be formed by using suitable alloy metalizations on a semiconductor chip. To enable a semiconductor chip rear side to be joined to the corresponding substrate first, and then a semiconductor chip top side to be joined to the corresponding substrate, two different alloy systems, which are suitable on account of their melting and joining properties, are used.

For example, for hot-joining of a first chip side by means of Au—Sn ($T_{melt}$=280° C.), it is possible to form a high-melting metallurgical contact comprising intermetallic phases with the first substrate. A silver layer is used firstly as a reaction partner for Au—Sn and secondly as a mechanically soft buffer to compensate for any differences in the expansion coefficients between substrate and semiconductor chip. In this case, at a first temperature of 280° C., the alloy on the second chip surface, which has a diffusion-soldering alloy comprising Au—Ge ($T_{melt}$=361° C.), should not melt and the reaction of the corresponding intermetallic phases of this second diffusion-soldering alloy should not be started.

In this context, minimal solid-state diffusion can be ignored. In a second diffusion-soldering step, the chip, which has already been joined to the first substrate, can then again be introduced into a hot process, in which the other, second side of the semiconductor chip surfaces is then joined to the second substrate. The second metalization system or diffusion-soldering system includes Au—Ge, and the buffer used in this case is a copper layer, which simultaneously serves as a reaction layer. Since the first diffusion-soldering alloy is already fully alloyed, it will no longer melt, especially since the diffusion-soldering temperatures of the intermetallic phases of the first diffusion-soldering system have a melting point >400° C.

The use of two diffusion soldering solders as metalizations on the top side and rear side of a semiconductor chip with two different melting points can allow staged jointing firstly of one side and then of the other side without the second diffusion soldering solder melting during the first jointing step, so that it reacts and can become unusable. On account of the use of different diffusion soldering solders, the present invention only allows a second jointing process at a high temperature, since when joining by the formation of an alloy, the melting point of the first joint increases so as to be higher than the melting point of the second joint.

If appropriate, a "diffusion-soldering alloy" is also to be understood as meaning a diffusion-soldering mixture. This applies in particular if no intermetallic phases have yet been produced. In a preliminary state of this type, the fractions of the subsequent alloy are already present as components. When it uses the term "diffusion-soldered joint-", the invention relates to the states of the later alloy with intermetallic phases in the microstructure.

FIG. 1 shows a diagrammatic cross section through a carrier 12 made from a semiconductor chip material with diffusion-soldered joints 16 to a lower first substrate 4 and an upper second substrate 5 in accordance with one embodiment of the invention. On its underside 2, the carrier 12 has an aluminum coating 20 which is covered by a titanium layer 21. This layer sequence 19 protects the aluminum and the semiconductor material of the carrier 12 from the components of the diffusion-soldering systems. In this case, the titanium layer forms a diffusion barrier and therefore also protects the aluminum layer.

The diffusion-soldered joints 16, 17 are matched to one another in such a manner that first of all the diffusion-soldered joint 16 can be produced at a low, first melting point, forming intermetallic phases, so that the second diffusion-soldered joint 17 can be realized at a significantly higher, second melting point. The first diffusion-soldered joint 16 in practice joints the rear side of a semiconductor chip 13 to a substrate 8, which is designed, for example, as a chip island 7, with a buffer layer 18 of copper or silver or alloys thereof being arranged as buffer and compensation layer between the diffusion-soldered joint 16 and the semiconductor 13. This buffer layer 18, if it includes silver, is at the same time a reservoir of silver for forming the diffusion-soldered layer 16.

In a first embodiment of the invention, the diffusion-soldered layer 16 is formed from a diffusion-soldering alloy which comprises Au-xSn where 10% by weight <x<30% by weight. The buffer layer 18 is composed of silver. The high thermal stability of this diffusion-soldered layer 16 is based on intermetallic phases between silver and tin, namely $Ag_3Sn$, with a melting point of 480° C., and $Ag_5Sn$, with a melting point of 724° C. These melting points of the intermetallic compounds are significantly higher than a second melting point which is required for the formation of the second diffusion-soldered layer 17. This second diffusion-soldered layer 17 is arranged on the top side 3 of the carrier 12.

On account of the semiconductor chip material used in this embodiment of the invention, the top side 9 of the semiconductor 13 is initially covered by the layer sequence 19 comprising an aluminum layer 20 and a titanium layer 21. This is followed by a buffer layer 18 comprising copper. The diffusion-soldered layer 17, which is joined to a second substrate 5 in such a manner as to withstand high temperatures, is arranged on this buffer layer 18.

The high thermal stability of the second diffusion-soldered layer 17 is achieved by intermetallic phases comprising copper and germanium. In this case, the intermetallic phase $Cu_3Ge$ has a melting point of 614° C., and the intermetallic phase $Cu_5Ge$ has a melting point of 743° C. In this embodiment of the invention, the second substrate is a flat conductor structure which is joined to contact surfaces of the semiconductor 13 by means of a diffusion-soldering process.

The overall structure as revealed in FIG. 1 represents a diagrammatic cross section through a power electronic component 11, which is both mechanically and thermally optimized on account of the diffusion-soldered joints 16 and 17 and the buffer layers 18. In this context, the buffer layer 18 ensures that thermal stresses between the substrates and the carrier are compensated for, and the diffusion-soldered layers 16 and 17 ensure that a thermally stable joint to the substrates is maintained even at high operating temperatures of a power electronic component.

FIGS. 2 to 4 show the production of diffusion-soldered joints on a carrier 12, as shown in FIG. 1, in stages.

A first stage of this production process is shown in FIG. 2, which shows a diagrammatic cross section through a carrier 12, which has a first diffusion-soldering alloy 14 on its underside 2 and a second diffusion-soldering alloy 15 on its top side 6. A buffer layer 18, which is composed of silver or copper on the underside of the carrier and has a copper layer on the top side of the carrier, is arranged between the diffusion-soldering alloys 14 and 15 and the carrier 12. Furthermore, to protect the semiconductor material of the carrier 12, a layer sequence comprising aluminum and titanium has been applied to the sides, the aluminum producing good contact with the semiconductor material and the titanium serving as a diffusion barrier for the material of the buffer layers, so that they do not react either with the aluminum or with the semiconductor material. A carrier 12 which has been prepared in this manner can then be placed onto a first substrate 4 and joined by way of the underside 2 of the carrier 12 in a diffusion-soldering process.

FIG. 3 shows a diagrammatic cross section through the carrier 12 shown in FIG. 2 after first diffusion-soldering of the carrier 12 onto the first substrate 4 or 8 at a melting point of over 280° C. This melting point 280° C. is required since the diffusion-soldering alloy 14 includes Au-xSn where 10% by weight $<x<30$% by weight. The intermetallic phases formed at this first melting point of 280° C. include $Ag_3Sn$ with a melting point of 480° C. and $Ag_5Sn$ with a melting point of 724° C. On account of the high first melting point of 280° C., the time required for the diffusion-soldering is significantly shorter than when using diffusion-soldering alloys with low first melting points of less than 50° C.

When intermetallic phases are being formed in the diffusion-soldered joint 16, some of the buffer layer 1 of silver can be consumed as a reaction partner for the intermetallic phases, which is represented in FIG. 3 by a reduced thickness of the buffer layer 18 compared to the buffer layer 18 shown in FIG. 2.

FIG. 4 shows a diagrammatic cross section through the carrier 12 shown in FIG. 3 prior to the application of a second substrate 5 or 10 to the top side 3 of the carrier 12. This second substrate may comprise flat conductors which are to be applied to contact surfaces of a semiconductor chip top side. The carrier 12 therefore includes a semiconductor material, which is initially provided with a low contact resistance to the semiconductor chip material by means of an aluminum layer 20, and then a diffusion-inhibiting titanium layer 21 is arranged on the aluminum layer 20. This layer sequence 19 is followed by a buffer layer 18, which on the top side 3 of the carrier 12 consists of copper. This copper is matched to the diffusion-soldering alloy 15 comprising Au-yGe where 7% by weight $<y<20$% by weight, remainder Au, so that intermetallic phases of copper and germanium are formed at the second melting point of over 361° C. The melting point of the intermetallic phases comprising $Cu_3Ge$ and $Cu_5Ge$ are 614° C. and 743° C., respectively. Prior to diffusion-soldering, the second substrate 5 is pressed onto the second diffusion-soldering alloy 15, and a diffusion-soldered joint, as shown in FIG. 5, is formed at the corresponding soldering temperature of over 361° C.

Figure 5:
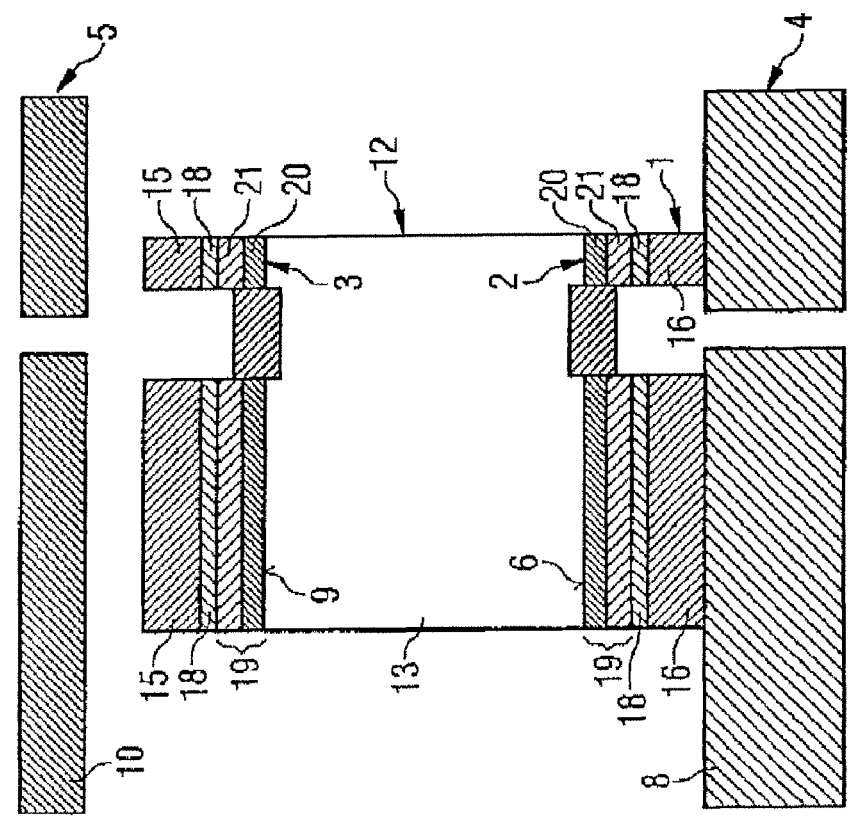
FIG. 5 shows a diagrammatic cross section through the carrier shown in FIG. 4 following diffusion-soldering of the second substrate to the top side of the carrier.

FIG. 5 shows a diagrammatic cross section through the carrier 12 shown in FIG. 4 after diffusion soldering of the second substrate 5 onto the top side 3 of the carrier 12 has taken place. This high melting point of over 361° C. allows rapid diffusion soldering without the diffusion soldering 16 on the underside of the carrier 12 being damaged, especially since the melting points of the intermetallic phases which have formed there are greater than 400° C.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

TABLE 1

| Alloy for joining (A or B) | Reaction partners and buffer (X) | $T_{melt}$, before | $T_{melt}$, after | Intermetallic phases |
|---|---|---|---|---|
| Ga-yNi(1<y<20 wt %) | Ag, Cu, Ni | 30,2° C. (!) | 362° C.;895° C. | $Ga_4Ni$; $Ni_2Ga_3$ |
| Ga-xCu (1 <x<40 wt %) | Ag, Cu, Ni | 28,6° C. (!) | 254° C.;485° C. | $Ga_2Cu$; $Ga_2Cu_3$ |
| Ga-yAg (1 <y<40 wt %) | Ag, Cu, Ni | 26° C. (!) | 425° C.;611° C. | $Ag_2Ga$; $Ag_5Ga$ |
| In-xAg (1 <x<30 wt %) | Ag, Cu, Ni | 144° C. | 660° C.;695° C. | $Ag_3In$ |
| Sn-yAg; (1<y <50 wt %) | Ag oder Cu | 221° C. | 480° C.;724° C. | $Ag_3Sn$; $Ag_5Sn$ |
| Au-xSn (10<x<30 wt %; 15<x<42 at %) ( des: 5<x<38 wt %; 8<x<50 at %) | Ag oder Cu | 280° C. | 480° C.;724° C. 415° C.;640° C. | $Ag_3Sn$; $Ag_5Sn$ $Cu_6Sn_5$; $Cu_3Sn$ |
| Au-yGe (7<y<20 wt %; 20<y<40 at %) ( des: 4<y<50 wt %; 10<y<75 at %) | Cu | 361° C. | 614° C.;743° C. | $Cu_3Ge$; $Cu_5Ge$ |

The invention claimed is:

1. A semiconductor device, comprising:
a semiconductor chip having a rear side and a top side with contact surfaces thereon,
a chip island having the rear side soldered thereto in a first diffusion-soldered joint from a first diffusing-soldering alloy having a first melting point,
flat conductors soldered to the contact surfaces on the top side of the semiconductor chip in a second diffusion-soldered joint from a second diffusion-soldering alloy having a second melting point;
wherein the first and second melting points are different.

2. The semiconductor device according to claim 1, wherein a metal layer of copper or silver or nickel is between the diffusion-soldered joints and the respective top side and rear side of the semiconductor chip.

3. The semiconductor device according to claim 1, wherein a layer sequence made up of aluminum and titanium is present on the sides of the semiconductor chip.

4. The semiconductor device according to claim 1, wherein the first diffusion-soldered joint has intermetallic phases including $Ag_3Sn$ and $Ag_5Sn$, and the second diffusion-soldered joint has intermetallic phases including $Cu_3Ge$ and $Cu_5Ge$.

5. A semiconductor device, comprising:
a chip island;
a semiconductor chip having a rear side and a top side with contact surfaces thereon;
a first diffusion-soldered joint from a first diffusion-soldering alloy having a first melting point situated between the rear side and the chip island;
flat conductors; and
a second diffusion-soldered joint from a second diffusion-soldering alloy having a second melting point situated between the top side and the flat conductors;
wherein the first and second melting points are different.

6. The semiconductor device according to claim 5, further comprising a buffer layer of silver situated between the first diffusion-soldering alloy and the rear side.

7. The semiconductor device according to claim 5, further comprising a buffer layer of silver situated between the second diffusion-soldering alloy and the top side.

8. The semiconductor device according to claim 5, further comprising a layer sequence made up of aluminum and titanium situated between the first diffusion-soldering alloy and the rear side.

9. The semiconductor device according to claim 5, further comprising a layer sequence made up of aluminum and titanium situated between the second diffusion-soldering alloy and the top side.

10. The semiconductor device according to claim 5, wherein the first diffusion-soldering alloy comprises Au-xSn where 10% by weight<x<30% by weight.

11. The semiconductor device according to claim 5, wherein the second diffusion-soldering alloy comprises Au-yGe where 7% by weight<y<20% by weight.

* * * * *